United States Patent
Mooney

(10) Patent No.: US 12,295,113 B2
(45) Date of Patent: May 6, 2025

(54) PANEL PC/HMI ADAPTER SYSTEM

(71) Applicant: Joe Clyde Mooney, Lula, GA (US)

(72) Inventor: Joe Clyde Mooney, Lula, GA (US)

( * ) Notice: Subject to any disclaimer, the term of this patent is extended or adjusted under 35 U.S.C. 154(b) by 0 days.

(21) Appl. No.: 18/812,772

(22) Filed: Aug. 22, 2024

(65) Prior Publication Data

US 2025/0071921 A1 Feb. 27, 2025

Related U.S. Application Data

(60) Provisional application No. 63/578,098, filed on Aug. 22, 2023.

(51) Int. Cl.
*H05K 5/06* (2006.01)
*H05K 5/02* (2006.01)

(52) U.S. Cl.
CPC ........... *H05K 5/061* (2013.01); *H05K 5/0217* (2013.01)

(58) Field of Classification Search
CPC ..... H05K 5/0217; H05K 5/061; G06F 1/1601
See application file for complete search history.

(56) References Cited

U.S. PATENT DOCUMENTS

| | | | | |
|---|---|---|---|---|
| 5,351,176 A | * | 9/1994 | Smith | G06F 1/181 348/827 |
| 5,631,805 A | * | 5/1997 | Bonsall | G06F 1/181 361/679.58 |
| 6,201,532 B1 | | 3/2001 | Tode et al. | |
| 7,812,891 B2 | * | 10/2010 | Maruta | H04N 5/64 348/789 |
| 8,503,170 B1 | * | 8/2013 | Hsu | G06F 1/1626 361/679.01 |
| 8,528,264 B1 | | 9/2013 | Thut et al. | |
| 8,800,764 B2 | * | 8/2014 | Wu | A45C 13/008 455/575.8 |
| 9,204,717 B2 | | 12/2015 | Moita Gorgulho Soares Branco | |
| 9,466,560 B2 | | 10/2016 | Kuo | |
| 9,504,172 B2 | * | 11/2016 | Raschilla | H05K 7/142 |
| 10,270,484 B2 | | 4/2019 | Lambert et al. | |
| 11,550,369 B2 | | 1/2023 | Silvanto et al. | |
| 11,882,667 B1 | * | 1/2024 | Mahoney | H05K 5/0052 |
| 2007/0169955 A1 | | 7/2007 | Pape et al. | |
| 2009/0180247 A1 | * | 7/2009 | Park | G02F 1/133314 445/24 |

(Continued)

*Primary Examiner* — Sagar Shrestha

(57) ABSTRACT

An electronic terminal enclosure adapter system capable of securely and hygienically connecting an electronic device to an enclosure. The enclosure adapter system comprises a device adapter and an enclosure adapter. The device adapter detachably connects to the electronic device, while the enclosure adapter detachably connects to the front side of the enclosure. After connecting each adapter to their respective components, the user can then detachably connect the device adapter to the enclosure adapter via a plurality of fasteners. The fully assembled enclosure adapter system creates a completely sealed environment for the electronic device within the enclosure, such that only the display portion of the electronic device is exposed for interaction and use. In addition to providing a sealed environment, the configuration and assembly of the enclosure adapter system allows for quick and simple installation/removal of the device adapter to/from the enclosure adapter.

19 Claims, 21 Drawing Sheets

(56) References Cited

U.S. PATENT DOCUMENTS

| | | | |
|---|---|---|---|
| 2009/0260844 A1* | 10/2009 | Tseng | G03B 17/08 |
| | | | 174/50.5 |
| 2012/0051022 A1* | 3/2012 | Dong | G02F 1/133308 |
| | | | 361/807 |
| 2012/0314354 A1* | 12/2012 | Rayner | G06F 1/1633 |
| | | | 361/679.01 |
| 2013/0187521 A1* | 7/2013 | Campagna | H05K 5/02 |
| | | | 312/223.1 |
| 2017/0017315 A1* | 1/2017 | Laflamme | G06F 3/0488 |
| 2022/0205284 A1 | 6/2022 | Cheung et al. | |

* cited by examiner

PANEL PC/HMI ADAPTER SYSTEM

FIELD OF THE INVENTION

The present invention relates generally to device enclosures and more specifically to a system of hardware for mounting a terminal display or panel PC to an enclosure.

BACKGROUND OF THE INVENTION

Panel PC devices are used in various fields as a way of quickly gathering or inputting information at the physical location of other work. Hygienic ratings, specifically Ingress Protection (IP) ratings, are given to device enclosures, based on the effectiveness of the electrical enclosure in blocking foreign bodies such as dust, moisture, liquid, and accidental contact. One area in particular in which high IP ratings are required for device enclosures is in food processing due to high water pressure and the associated use of strong chemicals in washing down work areas. The present invention also specifically provides hygienic ratings as required in food processing due to the proximity to food.

The weakest point in most terminal enclosures is the seam between the display and the front enclosure panel. Mounting clamps are used to seal the display device against the front enclosure panel, but adequate seals may not be achieved due to too much distance between mounting clamps or the mounting clamps not being correctly or precisely adjusted. Since sufficiently rated devices require a substantial number of clamps and fasteners installed to a precise specification, it can be time consuming to correctly replace a device enclosure to factory specifications in a repair setting, leading to slowed production or inadequate IP ratings.

The present invention is an electronic terminal enclosure adapter system that overcomes the above referenced limitations by providing two prefabricated adapter portions that can quickly be swapped out in a repair setting while maintaining sufficient IP ratings.

DETAIL DESCRIPTIONS OF THE INVENTION

All illustrations of the drawings are for the purpose of describing selected versions of the present invention and are not intended to limit the scope of the present invention.

In reference to FIGS. 1-21, the present invention is an electronic terminal enclosure adapter system 1 configured to securely and hygienically connect an electronic device D to an enclosure E. The electronic terminal enclosure adapter system 1 comprises a device adapter 2a and an enclosure adapter 2b. The present invention is configured to be used with an electronic device having a display portion.

Figure 1:
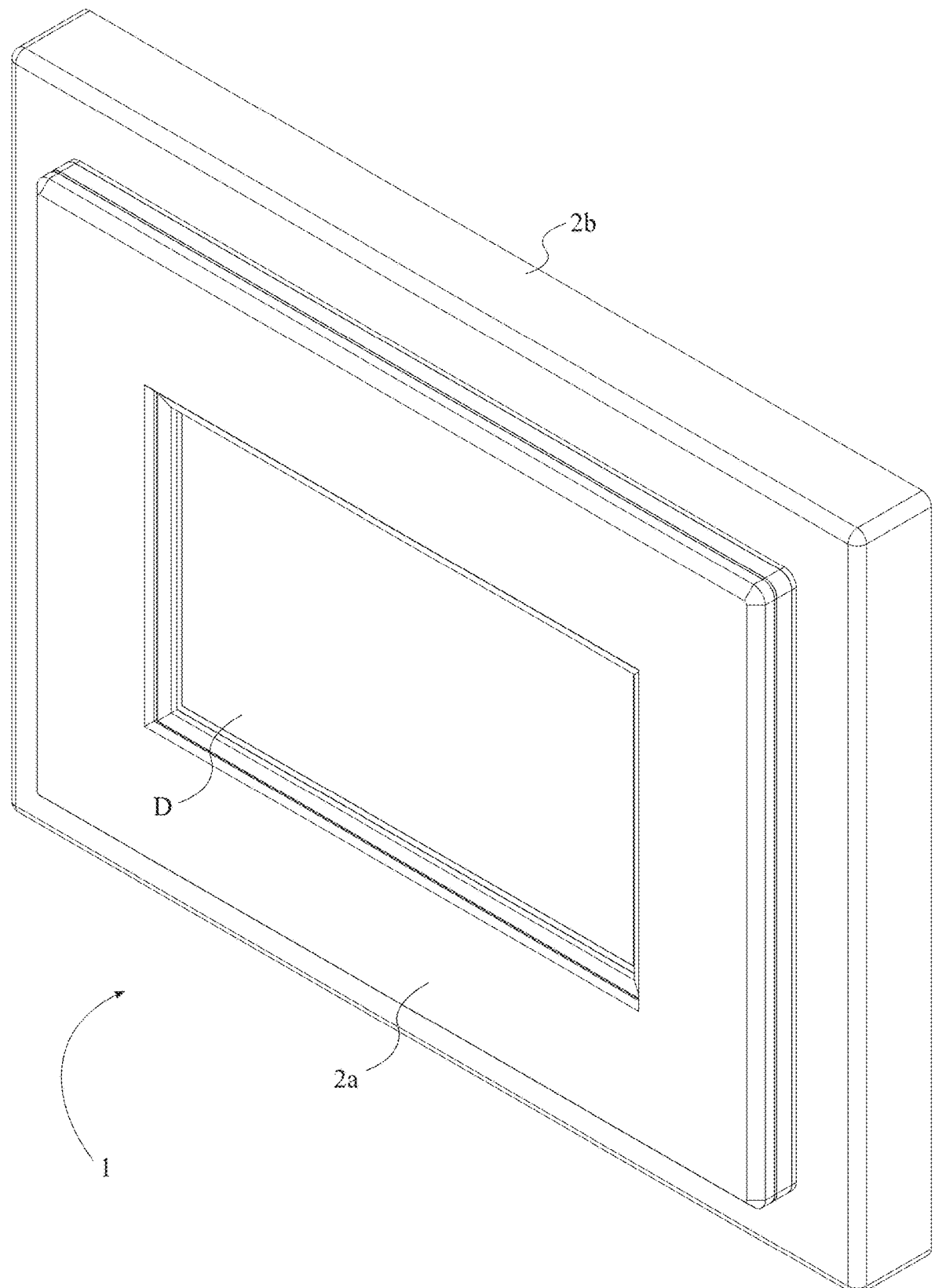
FIG. 1 is a top-front perspective view of the present invention.
Figure 2:
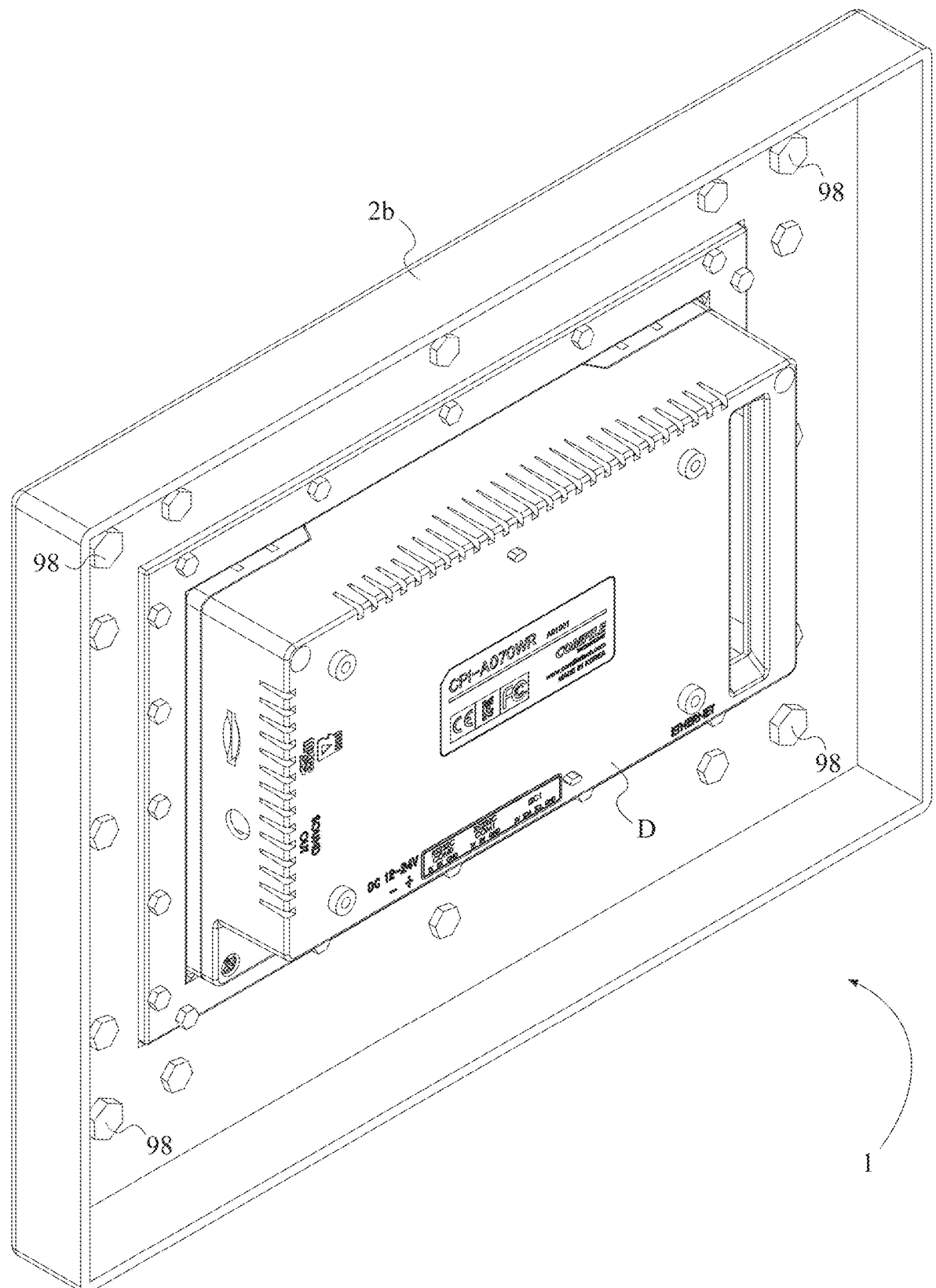
FIG. 2 is a top-rear perspective view of the present invention.
Figure 3:
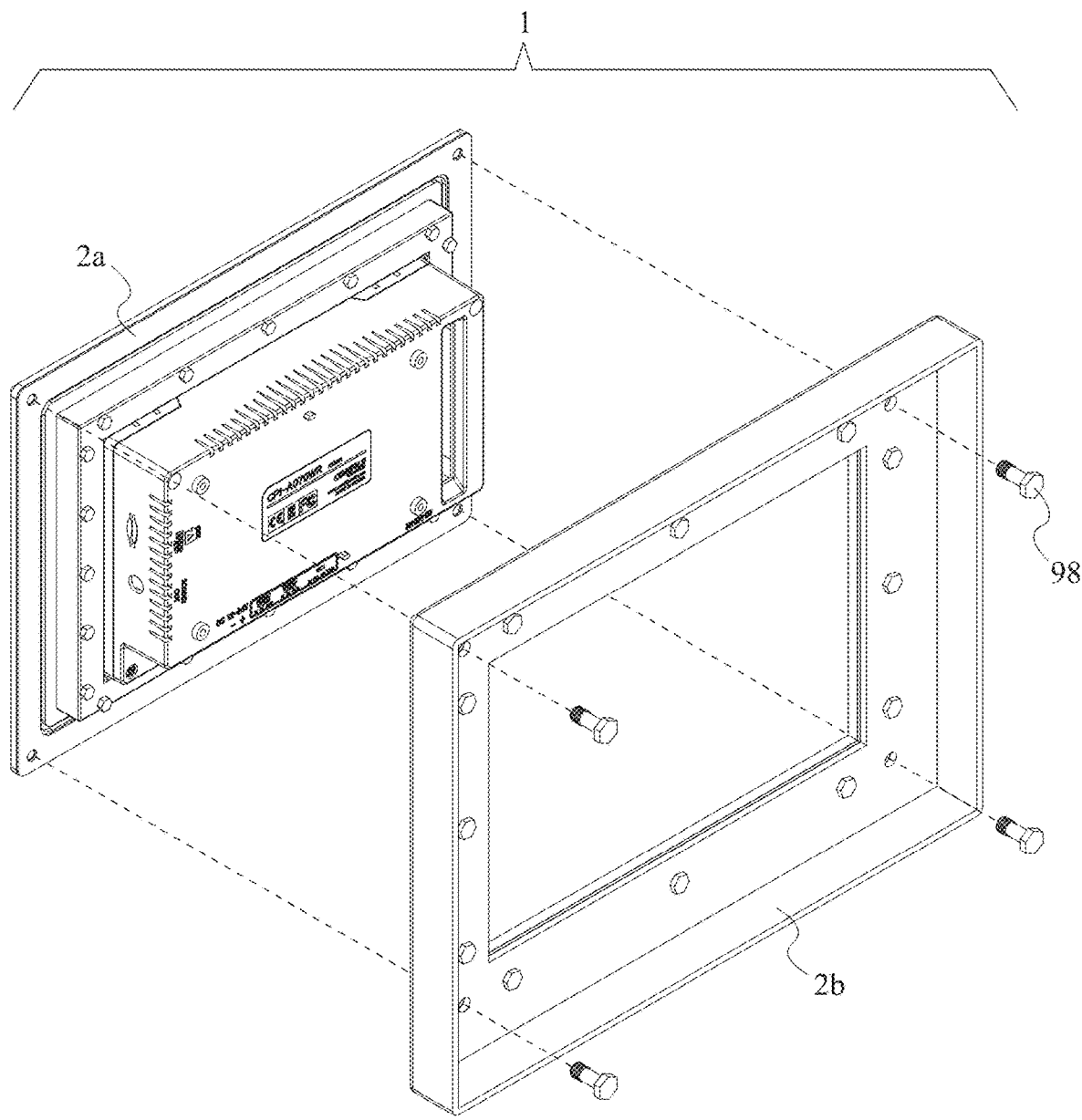
FIG. 3 is a top-rear perspective exploded view of the present invention.

The device adapter 2a detachably connects to an electronic device D, while the enclosure adapter 2b detachably connects to the front side of an enclosure E. As can be seen in FIG. 3, once both adapters 2a and 2b are secured to each of their respective components, the user can then detachably connect the device adapter 2a to the enclosure adapter 2b via a plurality of fasteners 98. To provide a water-tight seal at the connection point between the two adapters, an outer gasket 5 and an O-ring gasket 6 are compressed in between the device adapter 2a and the enclosure adapter 2b. An inner gasket 4 provides a water-tight seal around the display of the electronic device D, and an enclosure gasket 9 provides a water-tight seal around the enclosure E. As seen in FIGS. 1-2, the fully assembled enclosure adapter system 1 creates a completely sealed environment for the electronic device D within the enclosure E, such that only the display of the electronic device is exposed for interaction and use.

In addition to providing a sealed environment, the configuration and assembly of the electronic terminal enclosure adapter system 1 allows for quick and simple installation/removal of the device adapter 2a to/from the enclosure adapter 2b. Rather that removing a damaged or malfunctioning electronic device D from the device adapter 2a for replacement, a separate device adapter 2a may be already attached to a replacement electronic device D, allowing for simple replacement of the electronic device within an enclosure E without completely breaking down and retuning the connection between the front adapter block 3 and the device securing block 7 at the time of replacement. This system allows a user to maintain high IP rating without taking significant time during replacement of an electronic device D within an enclosure E.

Figure 4:
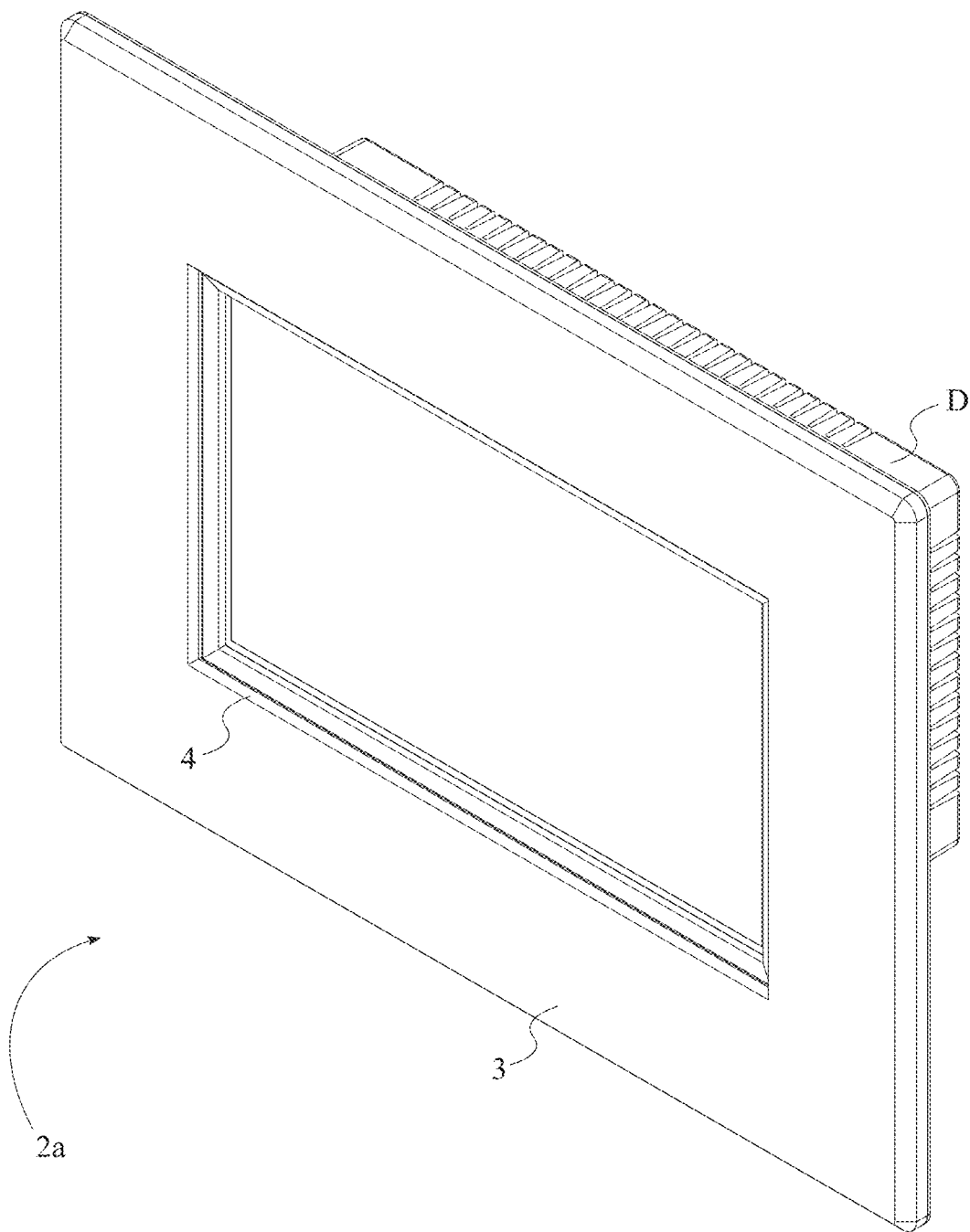
FIG. 4 is a top-front perspective view of the device adapter of the present invention.
Figure 5:
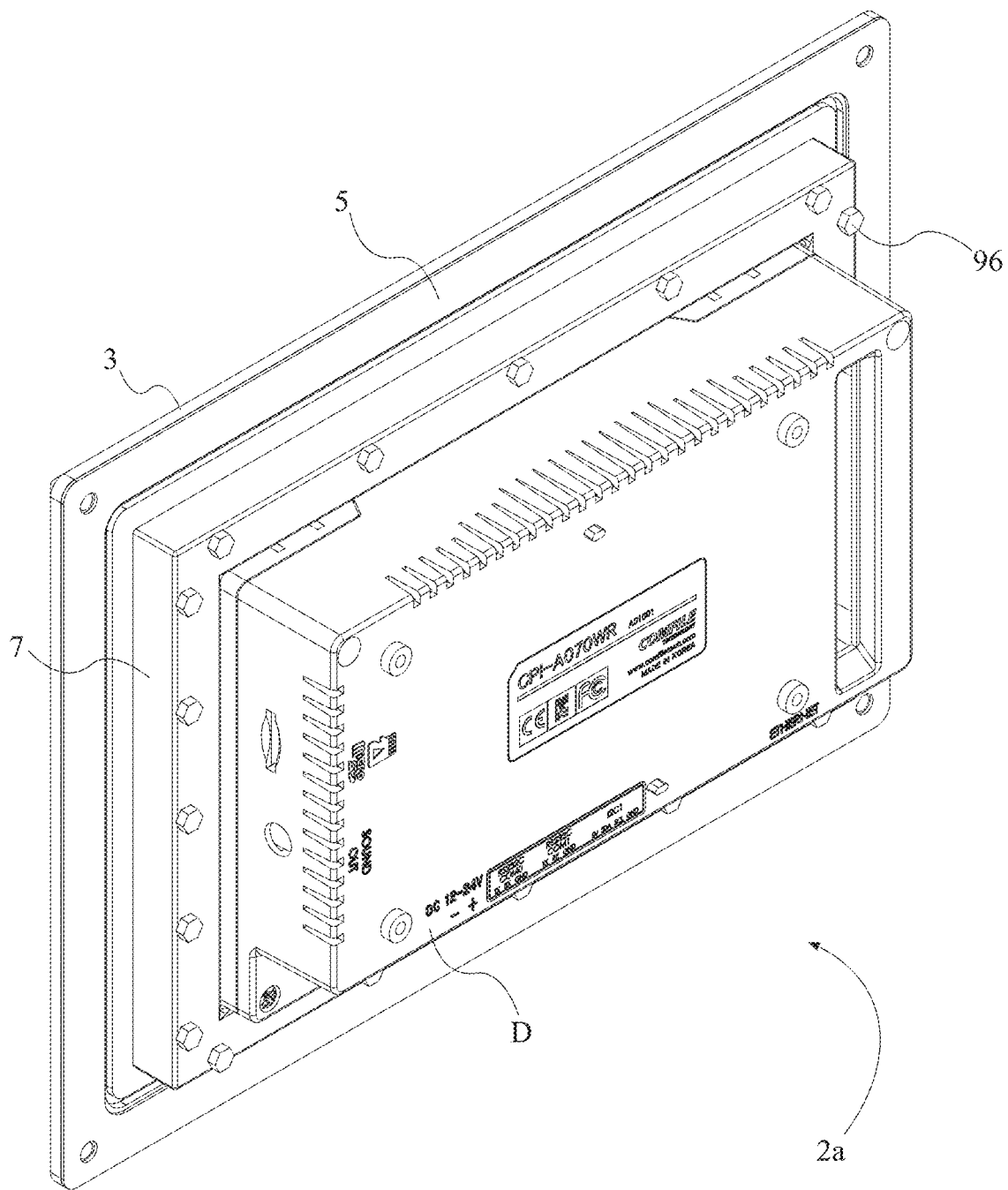
FIG. 5 is a top-rear perspective view of the device adapter of the present invention.
Figure 6:
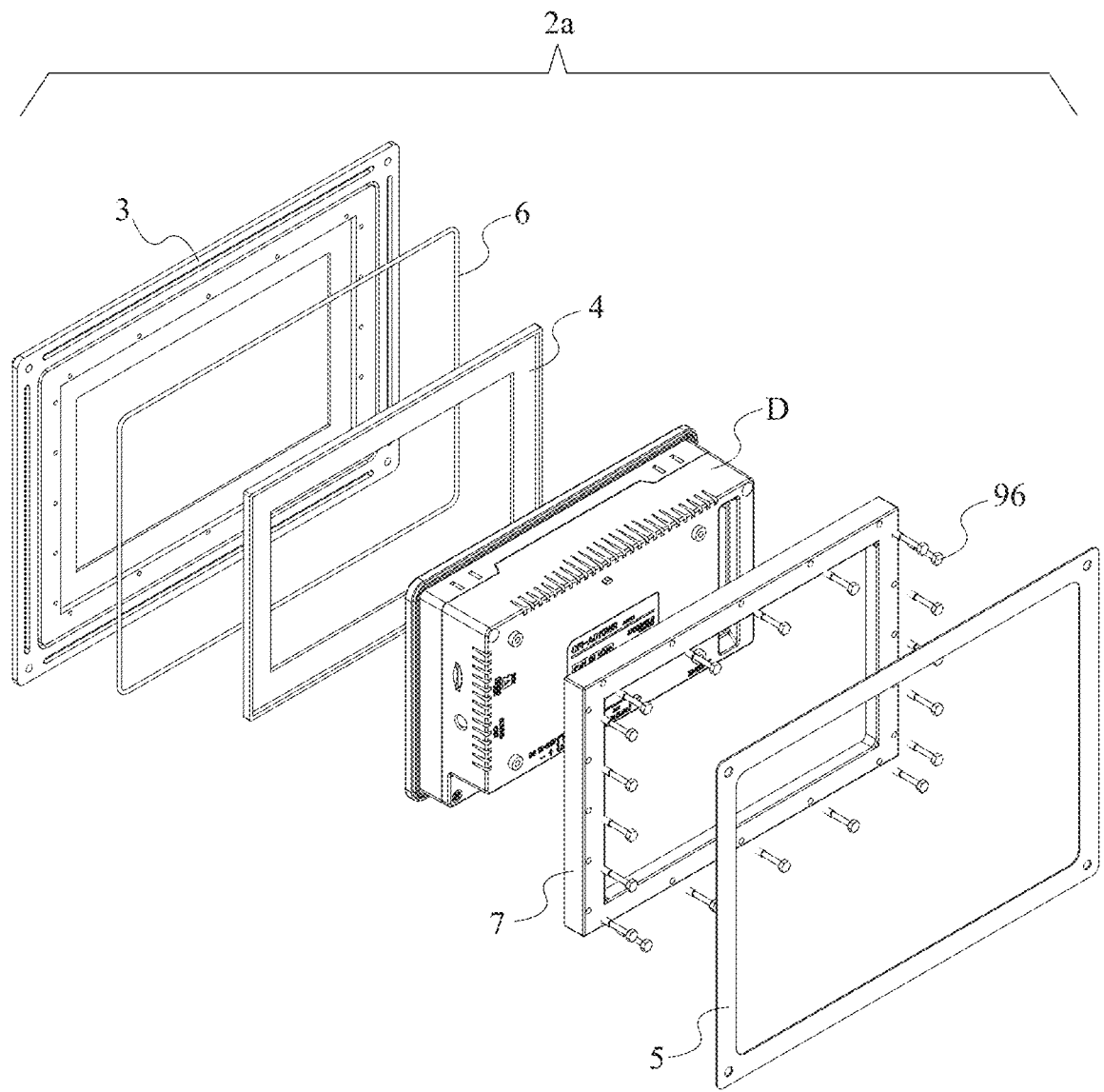
FIG. 6 is a top-rear perspective exploded view of the device adapter of the present invention.
Figure 10:
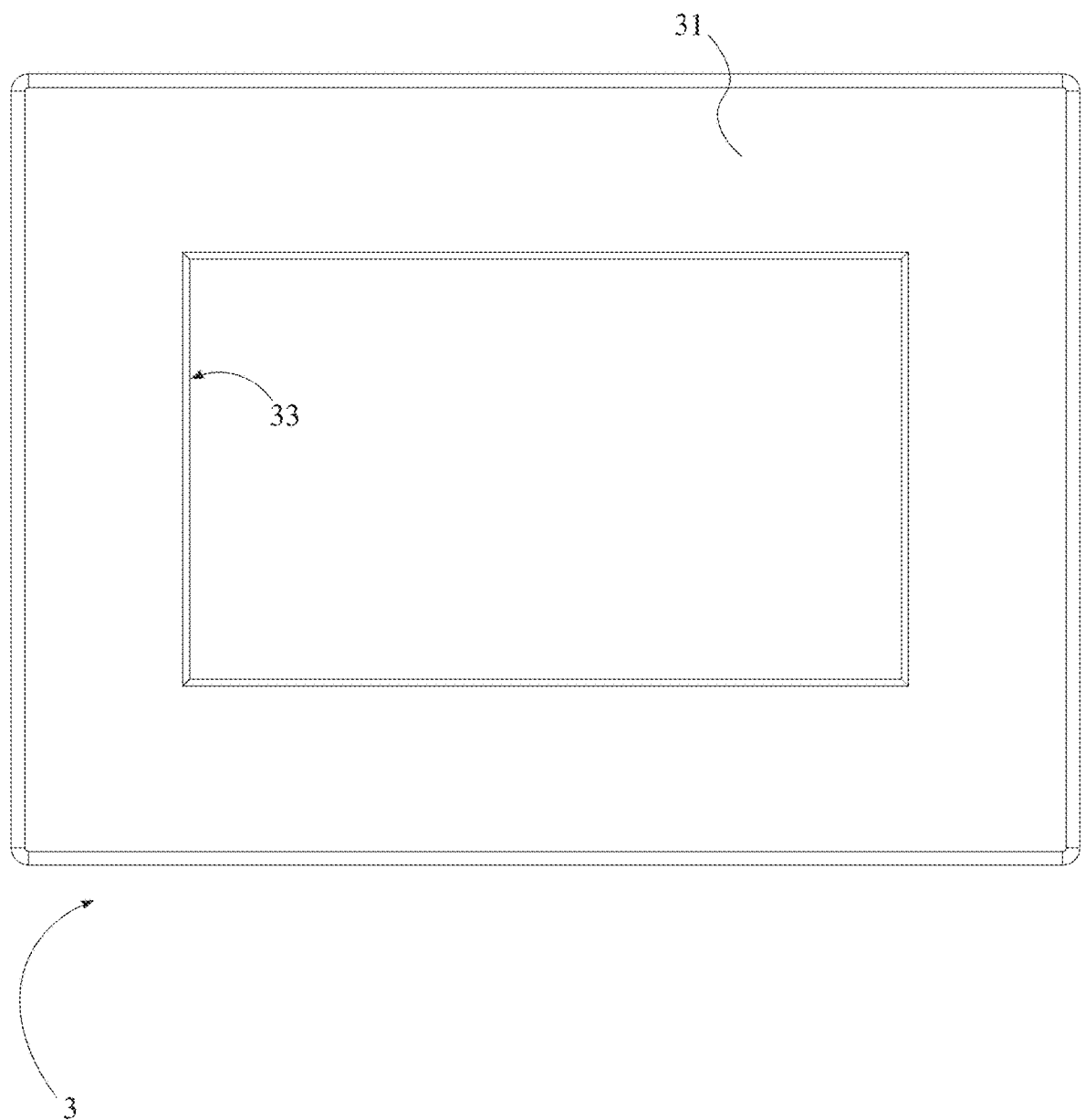
FIG. 10 is a front elevational view of the front adapter block of the present invention.
Figure 11:
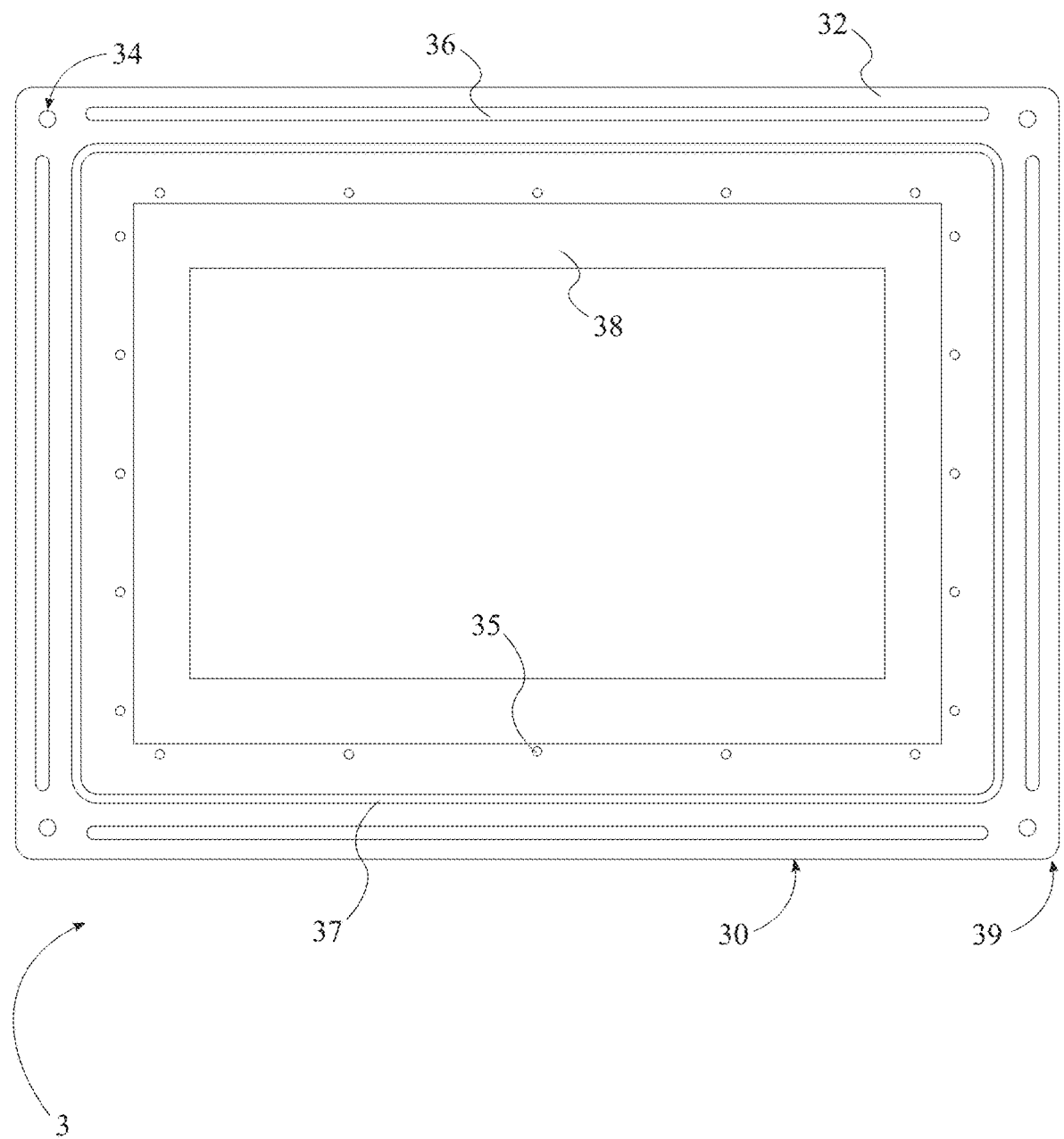
FIG. 11 is a rear elevational view of the front adapter block of the present invention.

The device adapter 2a is configured to surround and secure the display of the electronic device D, preventing foreign debris or moisture from reaching the internal components of the electronic device. As seen in FIGS. 4-6, the device adapter 2a comprises a front adapter block 3, an inner gasket 4, an outer gasket 5, an O-ring gasket 6, and a device securing block 7. The front adapter block 3 functions as the primary structural component of the device adapter 2a, as the remaining components of the device adapter 2a are configured upon the front adapter block 3. As seen in FIGS. 10-11, the front adapter block 3 has an outer edge 30, a front side 31, a rear side 32, and a central aperture 33. The rear side 32 of the front adapter block 3 further comprises a plurality of outer threaded openings 34, a plurality of inner threaded openings 35, a plurality of recessed grooves 36, an O-ring groove 37, and an inner recess area 38.

In the preferred embodiment, the front adapter block 3 is substantially rectangular in shape, wherein the central aperture 33 traverses through the front adapter block 3 from the rear side 32 to the front side 31, allowing access to the electronic device display. Preferably, the inner recess area 38 perimetrically surrounds the central aperture 33 and the plurality of inner threaded openings 35 perimetrically surrounds the inner recess area 38. The O-ring groove 37 perimetrically surrounds the plurality of inner threaded openings 35. Each of the plurality of recessed grooves 36 perimetrically surrounds the O-ring groove 37. Stated another way, each of the plurality of recessed grooves 36 is positioned in between the outer edges 30 of the front adapter block 3 and the O-ring groove 37. Lastly, each of the plurality of outer threaded openings 34 is positioned on the outer corners 39 of the front adapter block 3.

Figure 12:
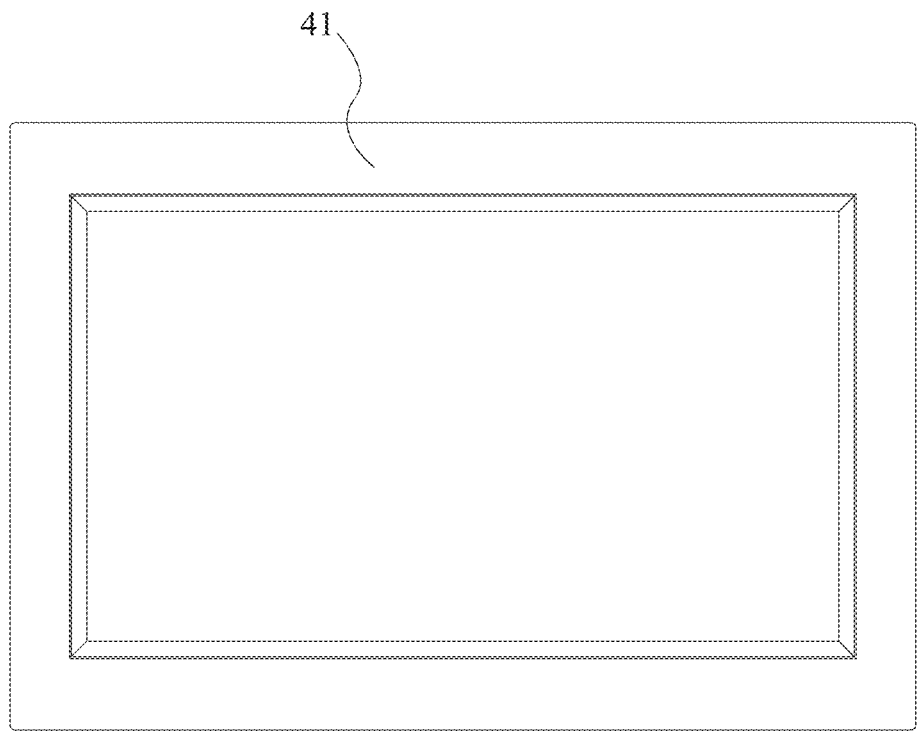
FIG. 12 is a front elevational view of the inner gasket of the present invention.
Figure 12:
Figure 13:
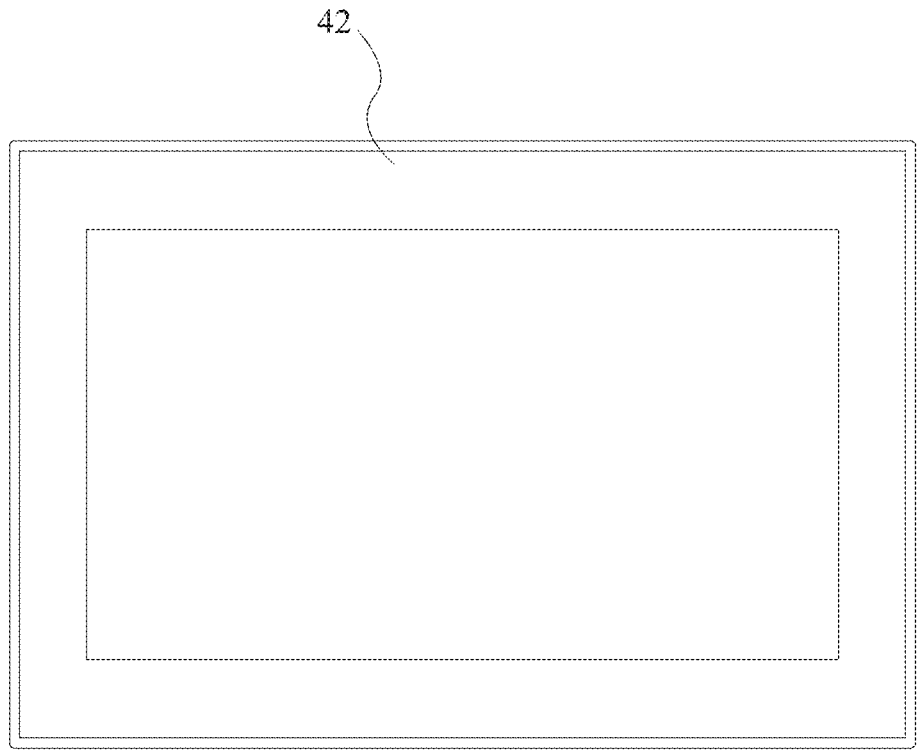
FIG. 13 is a rear elevational view of the inner gasket of the present invention.
Figure 13:
Figure 14:
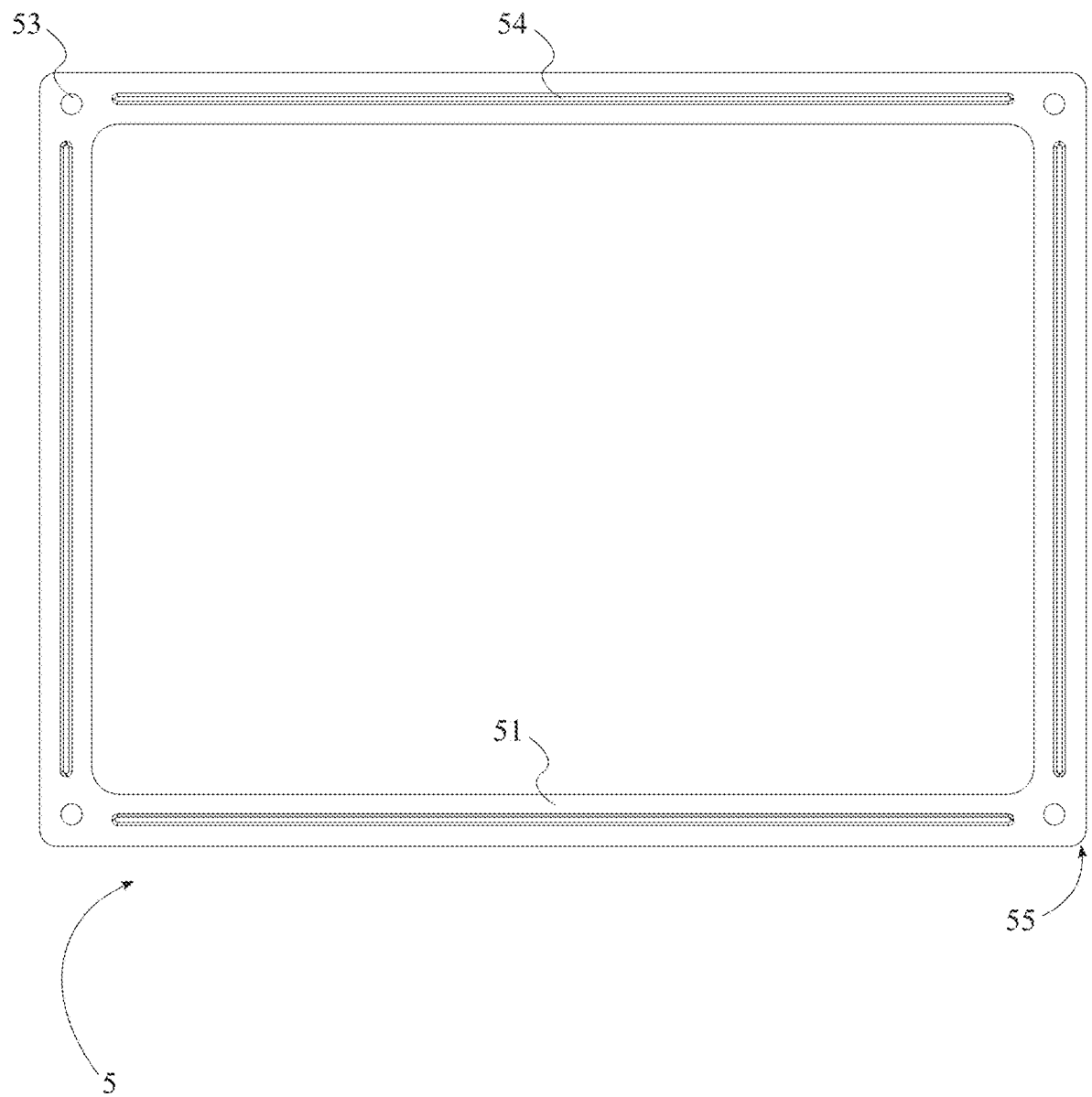
FIG. 14 is a front elevational view of the outer gasket of the present invention.
Figure 15:
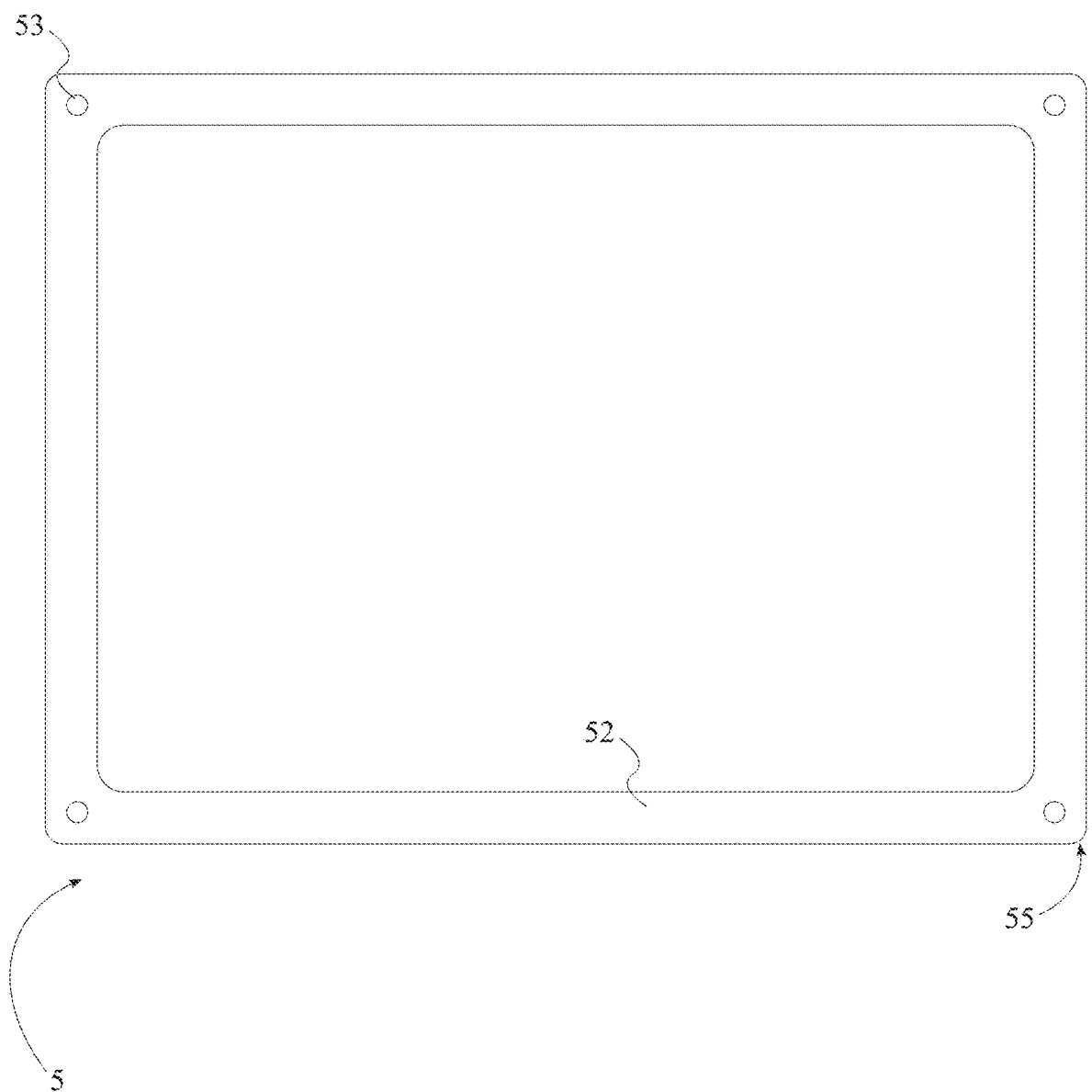
FIG. 15 is a rear elevational view of the outer gasket of the present invention.
Figure 16:
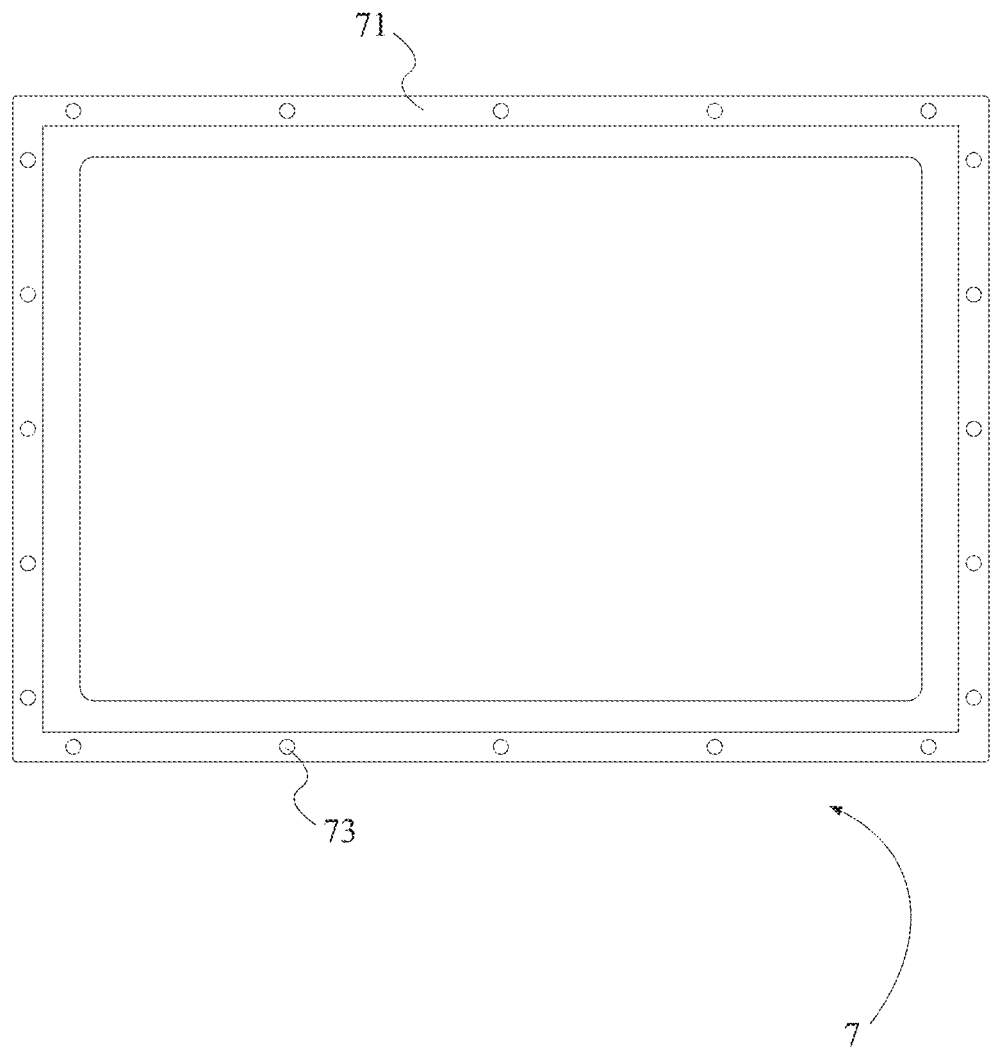
FIG. 16 is a front elevational view of the device securing block of the present invention.
Figure 17:
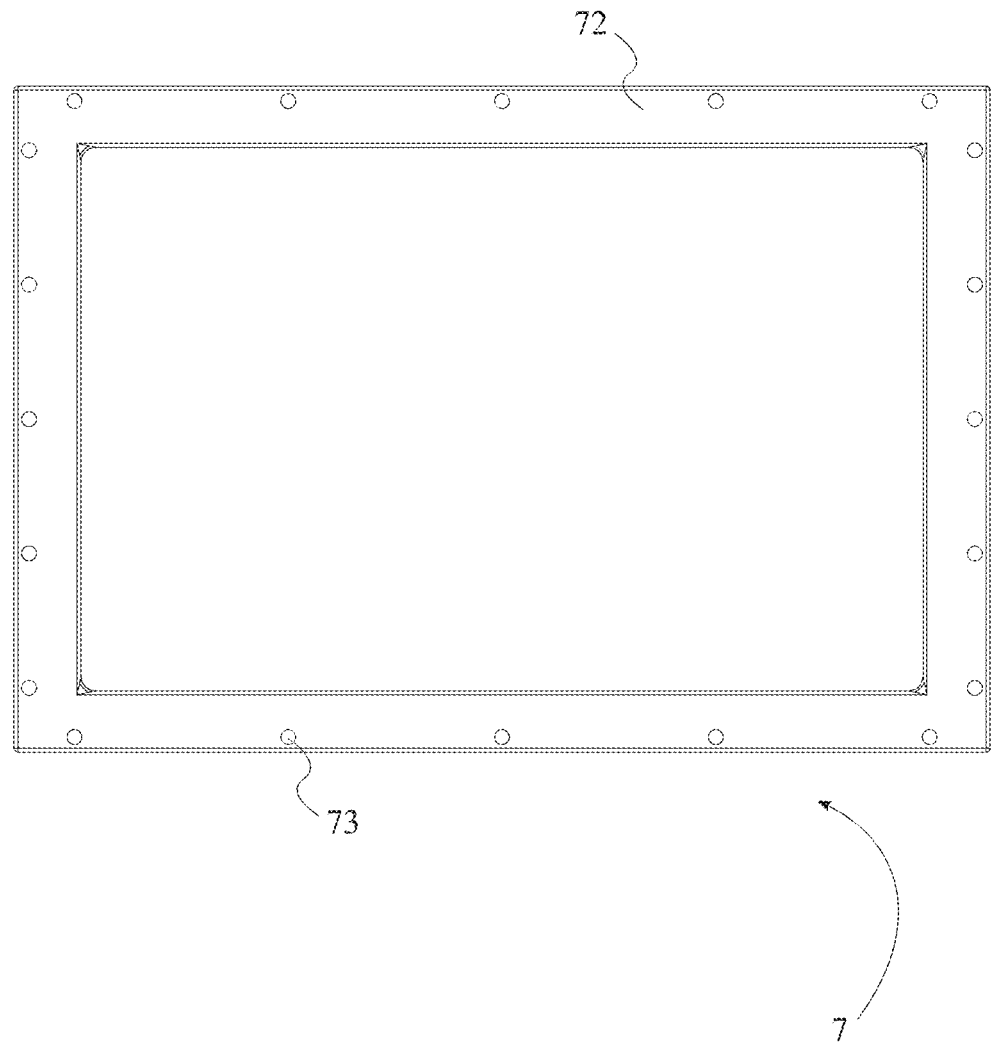
FIG. 17 is a rear elevational view of the device securing block of the present invention.

Each of the inner gasket 4, the outer gasket 5, the O-ring gasket 6, and the device securing block 7 connect to the front adapter block 3 to create the complete device adapter 2a. As seen in FIGS. 12-13, the inner gasket 4 is preferably a substantially rectangular frame having a front side 41 and a rear side 42. The front side 41 of the inner gasket 4 is connected to the inner recess area 38 of the front adapter block 3. As seen in FIGS. 14-15, the outer gasket 5 is preferably a substantially rectangular frame having a front side 51 and a rear side 52, wherein a plurality of corner holes 53 is positioned on the outer corners 55 of the outer gasket 5, traversing through from the rear side 52 to the front side 51. The outer gasket 5 may further comprise a plurality of protruding grooves 54 on the front side 51, configured to align and operably connect with the plurality of recessed grooves 36 of the front adapter block 3. Further, the outer gasket 5 has a larger perimeter than the inner gasket 4. The front side 51 of the outer gasket 5 is connected to the rear side 32 of the front adapter block 3, wherein the plurality of corner holes 53 is aligned with the plurality of outer threaded openings 34. The O-ring gasket 6 is preferably a thin, flexible, elongated band configured to fit within the O-ring groove 37 of the front adapter block 3. Finally, as seen in FIGS. 16-17, the device securing block 7 is preferably a substantially rectangular frame having a front side 71 and a rear side 72, wherein a plurality of perimeter holes 73 is disposed perimetrically around the device securing block 7, traversing through from the rear side 72 to the front side 71. The front side 71 of the device securing block 7 is connected to the rear side 32 of the front adapter block 3, wherein the plurality of perimeter holes 73 is aligned with the plurality of inner threaded openings 35.

Figure 7:
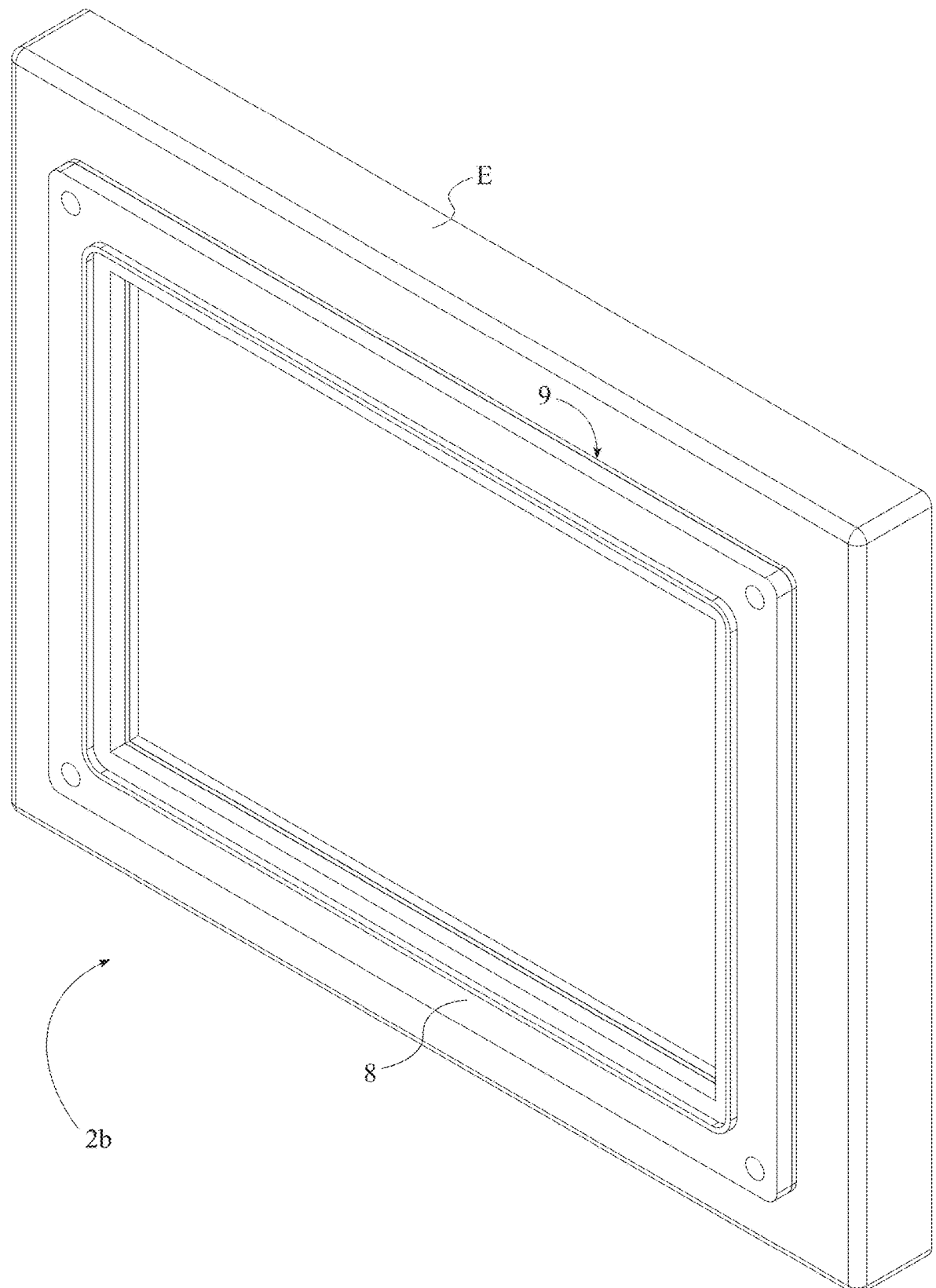
FIG. 7 is a top-front perspective view of the enclosure adapter of the present invention.
Figure 8:
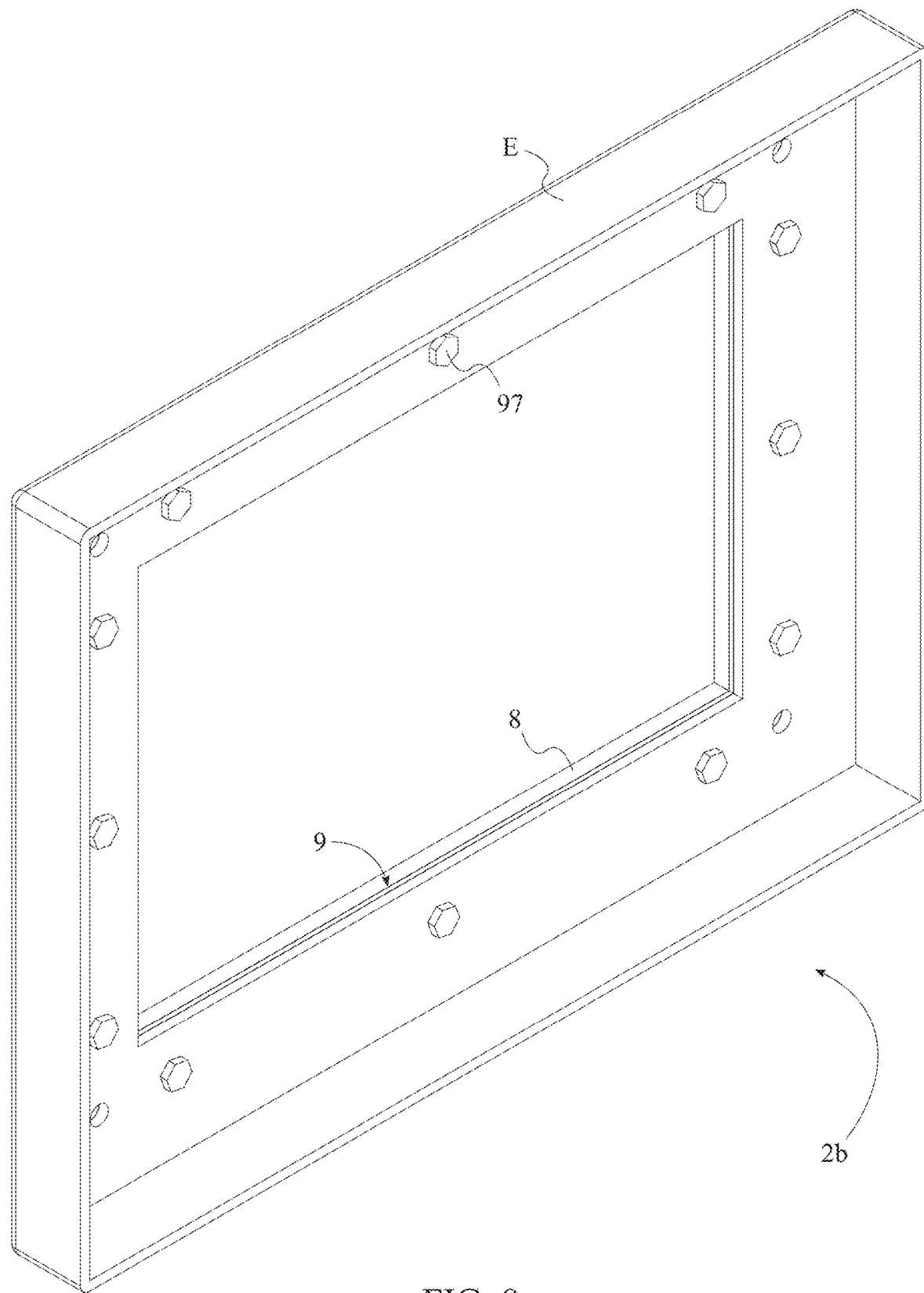
FIG. 8 is a top-rear perspective view of the enclosure adapter of the present invention.
Figure 9:
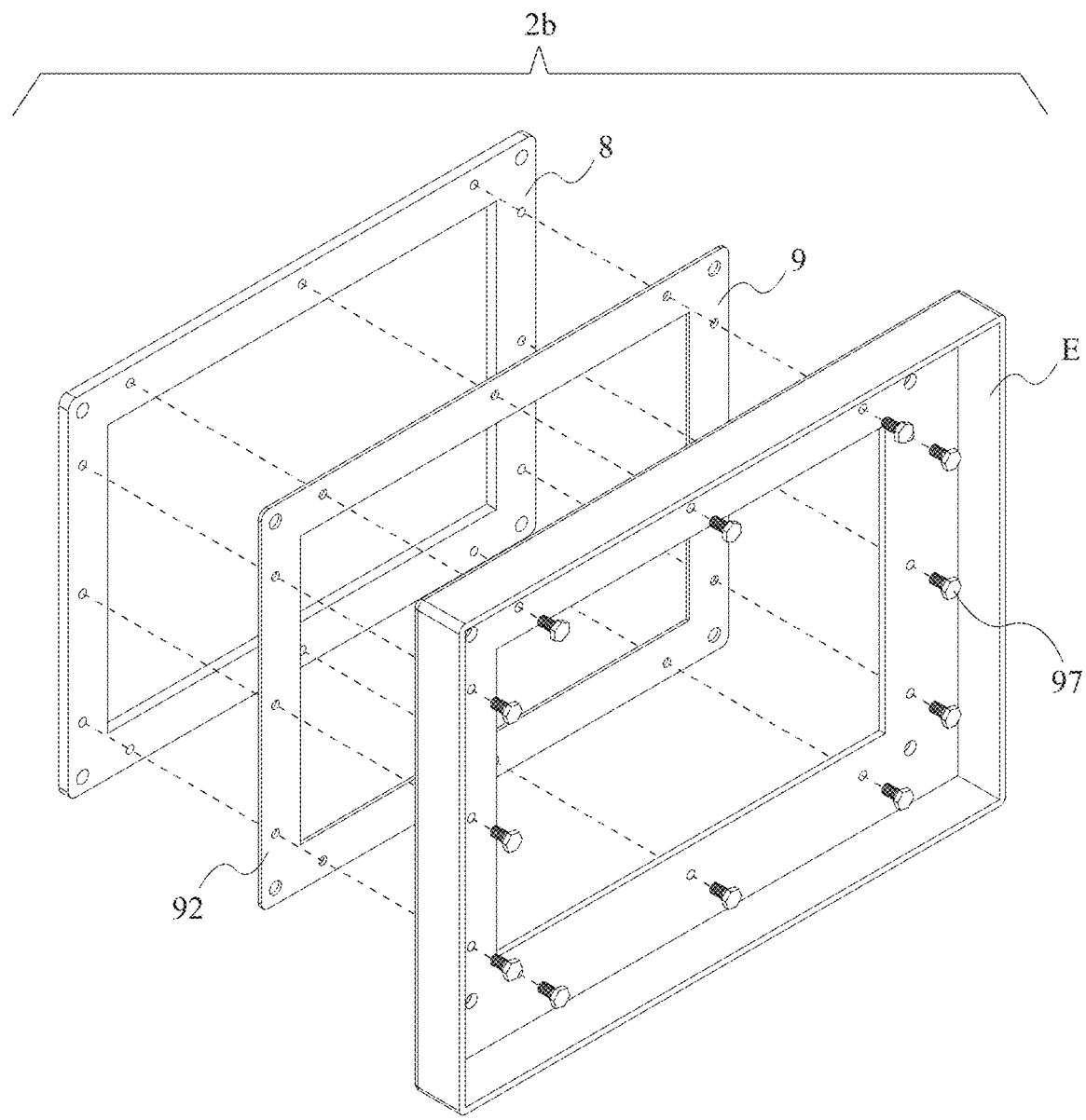
FIG. 9 is a top-rear perspective exploded view of the enclosure adapter of the present invention.
Figure 18:
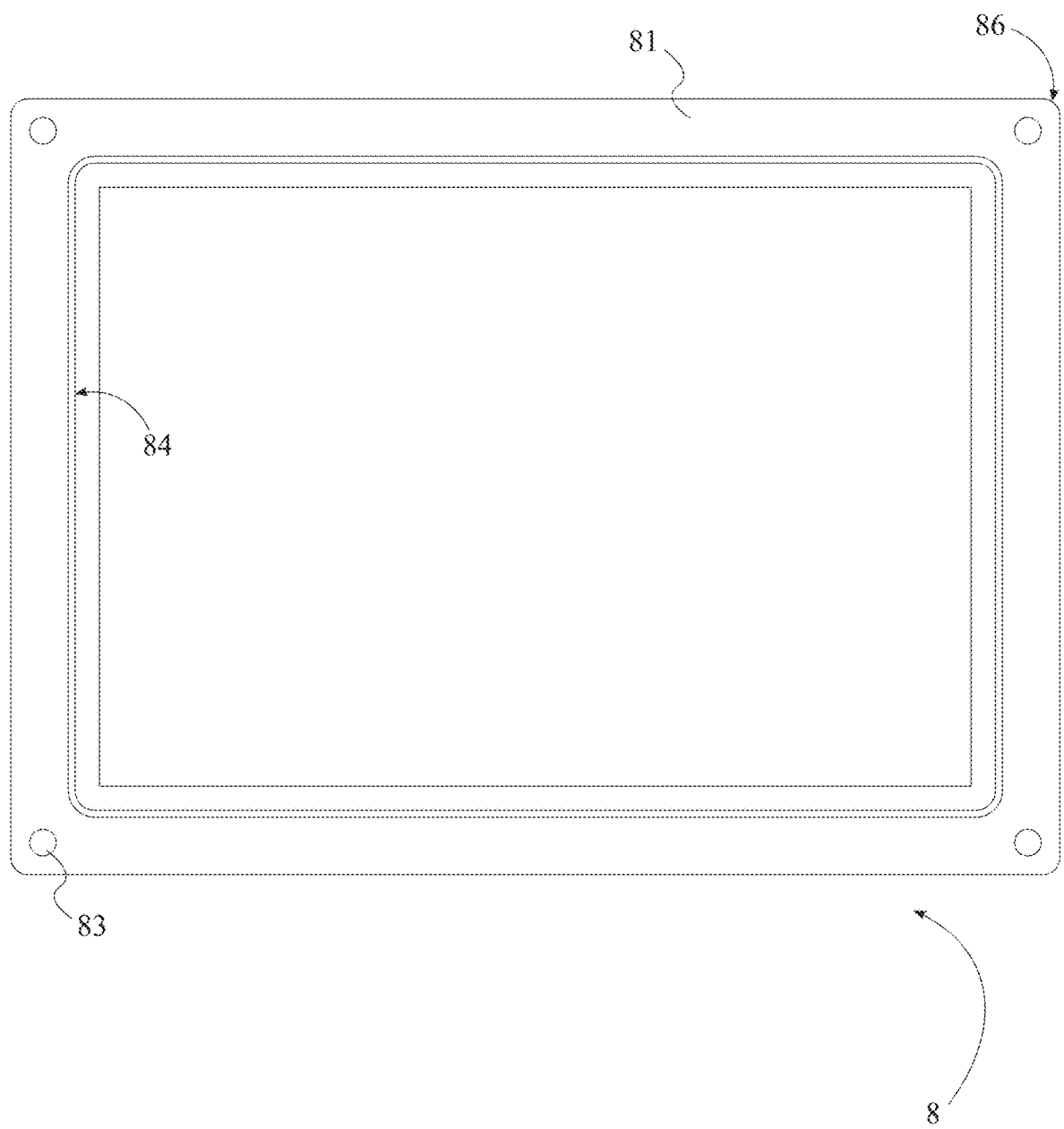
FIG. 18 is a front elevational view of the enclosure block of the present invention.
Figure 19:
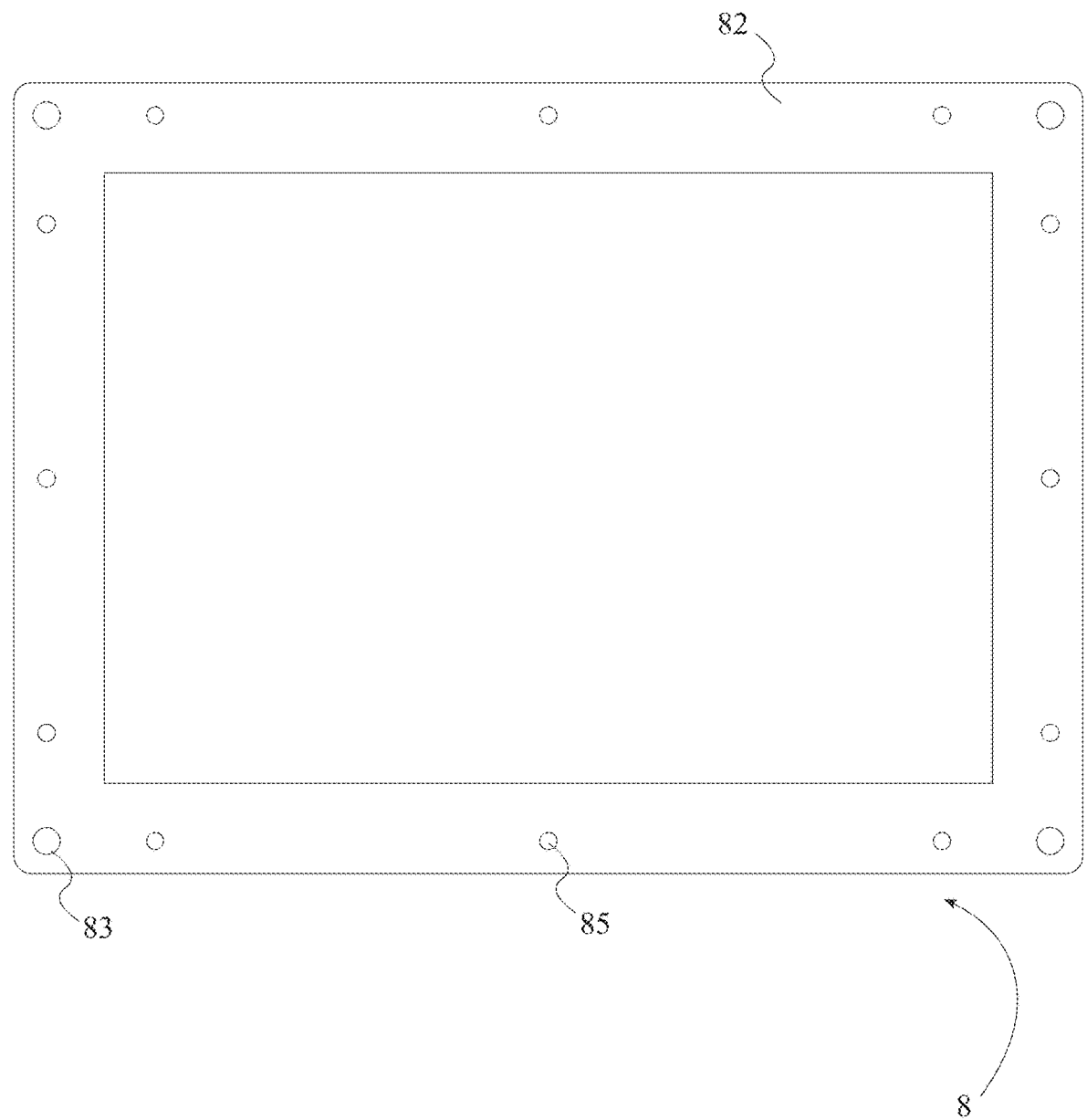
FIG. 19 is a rear elevational view of the enclosure block of the present invention.
Figure 20:
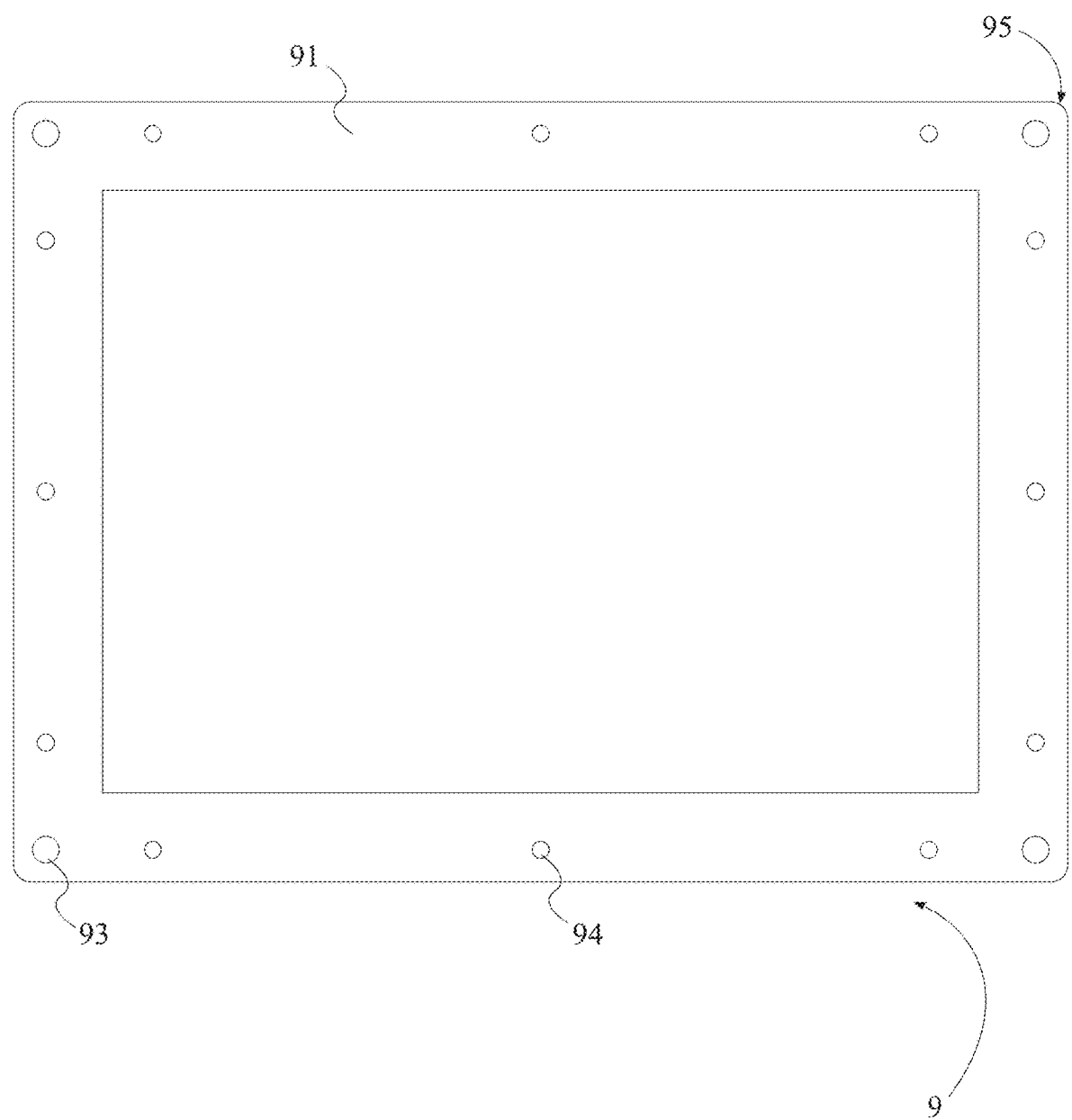
FIG. 20 is a front elevational view of the enclosure gasket of the present invention.

The enclosure adapter 2b is configured to connect to a device enclosure E, creating an interface for the device adapter 2a to easily and securely connect to the enclosure E through the enclosure adapter 2b. As seen in FIGS. 7-9, the enclosure adapter 2b comprises an enclosure block 8 and an enclosure gasket 9. As seen in FIGS. 18-19, the enclosure block 8 is a substantially rectangular frame having a front side 81 and a rear side 82, wherein a plurality of adapter holes 83 traverses through from the front side 81 to the rear side 82 on the outer corners 86 of the enclosure block 8. The enclosure block 8 further comprises an O-ring protrusion 84 positioned on the front side 81 and a plurality of threaded openings 85 on the rear side 82. As seen in FIG. 20, the enclosure gasket 9 is preferably a substantially rectangular frame of the same shape as the enclosure block 8, having a front side 91 and a rear side 92. The enclosure gasket 9 comprises a plurality of gasket adapter holes 93 traversing through the outer corners 95 of the enclosure gasket 9 from the front side 91 to the rear side 92. Further, a plurality of gasket enclosure holes 94 are arranged perimetrically around the enclosure gasket 9, traversing through the enclosure gasket 9 from the front side 91 to the rear side 92. The front side 91 of the enclosure gasket 9 is connected to the rear side 82 of the enclosure block 8, wherein the plurality of gasket adapter holes 93 are aligned with the plurality of adapter holes 83 of the enclosure block 8, and wherein the plurality of gasket enclosure holes 94 are aligned with the plurality of threaded openings 85 of the enclosure block 8.

Each of the front adapter block 3, the device securing block 7, and the enclosure block 8 are preferably made of stainless steel, aluminum, hard plastic, or similarly rigid material. Each of the inner gasket 4, the outer gasket 5, the O-ring gasket 6, and the enclosure gasket 9 are preferably made of a malleable material such as silicone or rubber, facilitating a secure and non-permeable connection between each of the rigid components of the present invention.

As best seen in FIG. 6, to connect the electronic device D to the device adapter 2a, the display of the electronic device D is arranged against the rear side 42 of the inner gasket 4. The device securing block 7 is then detachably connected to the front adapter block 3 via a first plurality of fasteners 96. Specifically, each of the first plurality of fasteners 96 is inserted through the plurality of perimeter holes 73 of the device securing block 7 and fastened into the plurality of inner threaded openings 35 of the front adapter block 3, thereby locking the electronic device D in place between the device securing block 7 and the inner gasket 4. With the electronic device D in place within the device adapter 2a, the central aperture 33 of the front adapter block 3 allows a user to access the display of the electronic device.

As best seen in FIG. 9, to connect the enclosure adapter 2b to the enclosure E, the enclosure adapter 2b is oriented so that both the rear side 82 of the enclosure block 8 and the rear side 92 of the enclosure gasket 9 are facing the enclosure E. Further, the rear side 92 of the enclosure gasket 9 is pressed up against the front side of the enclosure E. The enclosure adapter 2b is detachably connected to the enclosure E via a second plurality of fasteners 97. Specifically, each of the second plurality of fasteners 97 is inserted through the enclosure E, through the plurality of gasket enclosure holes 94, and fastened into the plurality of threaded openings 85 of the enclosure block 8.

As best seen in FIG. 3, to connect the device adapter 2a to the enclosure adapter 2b, the front side 81 of the enclosure block 8 is pressed up against the rear side 52 of the outer gasket 5. The O-ring protrusion 84 of the enclosure block 8 is configured to align and operably connect with the O-ring groove 37 of the front adapter block 3. In turn, the O-ring protrusion 84 is pressed up against the O-ring gasket 6, thereby sealing the electronic device D within. Further, the plurality of adapter holes 83 of the enclosure block 8 is aligned with the plurality of outer threaded openings 34 of the front adapter block 3. A third plurality of fasteners 98 is used to connect the device adapter 2a to the enclosure adapter 2b. Specifically, each of the third plurality of fasteners 98 extends through the enclosure E, through the plurality of gasket adapter holes 93 of the enclosure gasket 9, through the plurality of adapter holes 83 of the enclosure block 8, through the plurality of corner holes 53 of the outer gasket 5, and fastened into the plurality of outer threaded openings 34 of the front adapter block 3.

Figure 21:
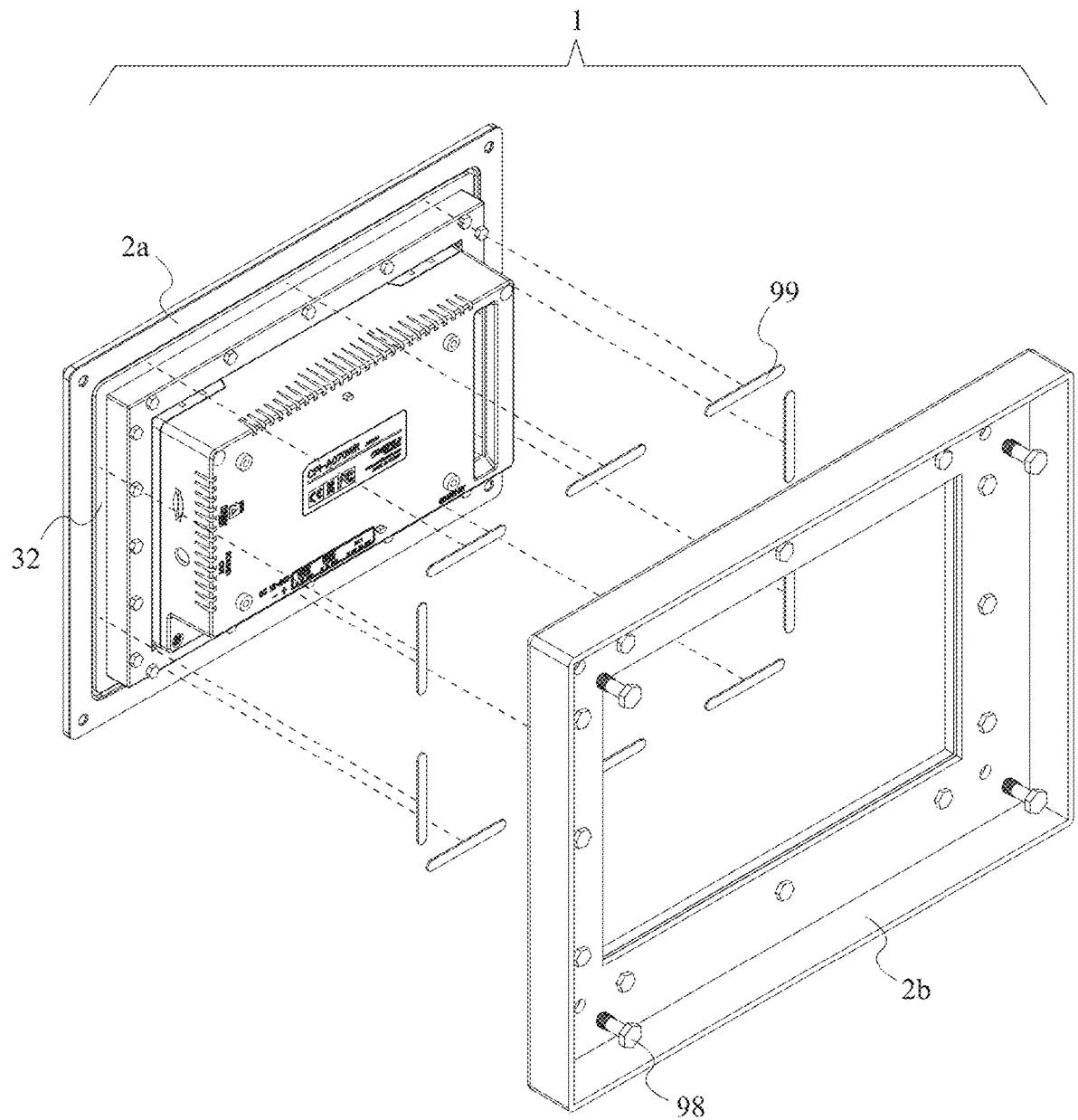
FIG. 21 is a top-rear perspective exploded view of the present invention in accordance with another embodiment, showing the spacing tabs.

In another embodiment, as seen in FIG. 21, a gap set feature may be employed, creating a small gap between the device adapter 2*a* and the enclosure adapter 2*b*. The gap set feature is in the form of a plurality of spacing tabs 99. The plurality of spacing tabs 99 are arranged between the device adapter 2*a* and the enclosure adapter 2*b*. Each of the plurality of spacing tabs 99 can be attached either to the front side 81 of the enclosure block 8 or the rear side 32 of the front adapter block 3. The means of attaching the plurality of spacing tabs 99 can be of any known technique used in the industry, including but not limited to adhesive bonding. With the plurality of spacing tabs 99 in place, a small gap is formed between the front side 81 of the enclosure block 8 and the rear side 32 of the front adapter block 3. The small gap is specifically sized to create the correct level of compression on the associated gaskets in order to meet requirements for the desired IP ratings.

Although the invention has been explained in relation to its preferred embodiment, it is to be understood that many other possible modifications and variations can be made without departing from the spirit and scope of the invention.

What is claimed is:

1. An electronic terminal enclosure system comprising:
a device adapter;
an enclosure adapter;
the device adapter comprising a front adapter block, an inner gasket, an outer gasket, and an O-ring gasket;
the enclosure adapter comprising an enclosure block and an enclosure gasket;
the front adapter block comprising a central aperture, an O-ring groove, and an inner recess area;
each of the O-ring groove and the inner recess area being disposed on a rear side of the front adapter block;
the inner gasket being positioned within the inner recess area; the O-ring gasket being positioned within the O-ring groove;
the outer gasket being connected to the rear side of the front adapter block;
the enclosure adapter being detachably connected to an enclosure; and
a plurality of threaded openings being disposed on a rear side of the enclosure block;
the enclosure block being detachably connected to the enclosure via a second plurality of fasteners;
each of the second plurality of fasteners being inserted through the enclosure, through the enclosure gasket, and fastened into the plurality of threaded openings of the enclosure block; and
the device adapter being detachably connected to the enclosure adapter.

2. The electronic terminal enclosure system as claimed in claim 1 comprising:
the device adapter further comprising a device securing block;
a plurality of inner threaded openings being disposed on the rear side of the front adapter block;
a front side of the device securing block being detachably connected to the rear side of the front adapter block via a first plurality of fasteners; and
the device adapter capable of locking an electronic device in between the device securing block and the inner gasket.

3. The electronic terminal enclosure system as claimed in claim 2 comprising:
the inner recess area perimetrically surrounding the central aperture;
the plurality of inner threaded openings perimetrically surrounding the inner recess area;
the O-ring groove perimetrically surrounding the plurality of inner threaded openings;
a plurality of perimeter holes being disposed on a rear side of the device securing block; and
each of the first plurality of fasteners being inserted through the plurality of perimeter holes and fastened into the plurality of inner threaded openings of the front adapter block.

4. The electronic terminal enclosure system as claimed in claim 3 comprising:
the front adapter block further comprising a plurality of recessed grooves;
the outer gasket comprising a plurality of protruding grooves;
each of the plurality of recessed grooves being disposed on the rear side of the front adapter block, perimetrically surrounding the O-ring groove;
each of the plurality of protruding grooves being positioned on a front side of the outer gasket; and
each of the plurality of protruding grooves being configured to align and operably connect with the plurality of recessed grooves.

5. The electronic terminal enclosure system as claimed in claim 4 comprising:
a plurality of spacing tabs; and
each of the plurality of spacing tabs being positioned between the front side of the enclosure block and the rear side of the front adapter block.

6. The electronic terminal enclosure system as claimed in claim 1 comprising:
a plurality of outer threaded openings being disposed on the rear side of the front adapter block;
a plurality of adapter holes being disposed on the front side of the enclosure block;
the front adapter block being detachably connected to the enclosure block via a third plurality of fasteners; and
each of the third plurality of fasteners being inserted through the enclosure, through the plurality of adapter holes, and fastened into the plurality of outer threaded openings.

7. The electronic terminal enclosure system as claimed in claim 1 comprising:
the enclosure block further comprising an O-ring protrusion;
the O-ring protrusion being disposed on a front side of the enclosure block; and
the O-ring protrusion being configured to align and operably connect with the O-ring groove of the front adapter block.

8. The electronic terminal enclosure system as claimed in claim 1, wherein each of the front adapter block and the enclosure block are rectangular in shape.

9. An electronic terminal enclosure system comprising:
a device adapter;
an enclosure adapter;
the device adapter comprising a front adapter block, an inner gasket, an outer gasket, an O-ring gasket, and a device securing block;

the enclosure adapter comprising an enclosure block and an enclosure gasket;

the front adapter block comprising a central aperture, a plurality of inner threaded openings, an O-ring groove, and an inner recess area;

each of the plurality of inner threaded openings, the O-ring groove, and the inner recess area being disposed on a rear side of the front adapter block;

the inner recess area perimetrically surrounding the central aperture;

the plurality of inner threaded openings perimetrically surrounding the inner recess area;

the O-ring groove perimetrically surrounding the plurality of inner threaded openings;

the inner gasket being positioned within the inner recess area;

the O-ring gasket being positioned within the O-ring groove;

the outer gasket being connected to the rear side of the front adapter block;

a front side of the device securing block being detachably connected to the rear side of the front adapter block via a first plurality of fasteners;

a plurality of perimeter holes being disposed on a rear side of the device securing block;

each of the first plurality of fasteners being inserted through the plurality of perimeter holes and fastened into the plurality of inner threaded openings of the front adapter block;

the device adapter capable of locking an electronic device in between the device securing block and the inner gasket;

the enclosure adapter being detachably connected to an enclosure; and the device adapter being detachably connected to the enclosure adapter.

10. The electronic terminal enclosure system as claimed in claim 9 comprising:

a plurality of spacing tabs;

each of the plurality of spacing tabs being positioned between the front side of the enclosure block and the rear side of the front adapter block;

the front adapter block further comprising a plurality of recessed grooves;

the outer gasket comprising a plurality of protruding grooves;

each of the plurality of recessed grooves being disposed on the rear side of the front adapter block, perimetrically surrounding the O-ring groove;

each of the plurality of protruding grooves being positioned on a front side of the outer gasket; and each of the plurality of protruding grooves being configured to align and operably connect with the plurality of recessed grooves.

11. The electronic terminal enclosure system as claimed in claim 9 comprising:

a plurality of threaded openings being disposed on a rear side of the enclosure block;

the enclosure block being detachably connected to the enclosure via a second plurality of fasteners; and each of the second plurality of fasteners being inserted through the enclosure, through the enclosure gasket, and fastened into the plurality of threaded openings of the enclosure block.

12. The electronic terminal enclosure system as claimed in claim 11 comprising:

a plurality of outer threaded openings being disposed on the rear side of the front adapter block;

a plurality of adapter holes being disposed on the front side of the enclosure block;

the front adapter block being detachably connected to the enclosure block via a third plurality of fasteners; and each of the third plurality of fasteners being inserted through the enclosure, through the plurality of adapter holes, and fastened into the plurality of outer threaded openings.

13. The electronic terminal enclosure system as claimed in claim 11 comprising:

the enclosure block further comprising an O-ring protrusion;

the O-ring protrusion being disposed on a front side of the enclosure block; and the O-ring protrusion being configured to align and operably connect with the O-ring groove of the front adapter block.

14. The electronic terminal enclosure system as claimed in claim 9, wherein each of the front adapter block, the device securing block, and the enclosure block are rectangular in shape.

15. An electronic terminal enclosure system comprising:

a device adapter;

an enclosure adapter;

a plurality of spacing tabs;

the device adapter comprising a front adapter block, an inner gasket, an outer gasket, an O-ring gasket, and a device securing block;

the enclosure adapter comprising an enclosure block and an enclosure gasket;

the front adapter block comprising a central aperture, a plurality of inner threaded openings, an O-ring groove, and an inner recess area;

each of the plurality of inner threaded openings, the O-ring groove, and the inner recess area being disposed on a rear side of the front adapter block;

the inner recess area perimetrically surrounding the central aperture;

the plurality of inner threaded openings perimetrically surrounding the inner recess area;

the O-ring groove perimetrically surrounding the plurality of inner threaded openings;

the inner gasket being positioned within the inner recess area;

the O-ring gasket being positioned within the O-ring groove;

the outer gasket being connected to the rear side of the front adapter block;

a front side of the device securing block being detachably connected to the rear side of the front adapter block via a first plurality of fasteners;

a plurality of perimeter holes being disposed on a rear side of the device securing block;

each of the first plurality of fasteners being inserted through the plurality of perimeter holes and fastened into the plurality of inner threaded openings of the front adapter block;

the device adapter capable of locking an electronic device in between the device securing block and the inner gasket;

the enclosure adapter being detachably connected to an enclosure;

each of the plurality of spacing tabs being positioned between the front side of the enclosure block and the rear side of the front adapter block; and the device adapter being detachably connected to the enclosure adapter.

16. The electronic terminal enclosure system as claimed in claim 15 comprising:

the front adapter block further comprising a plurality of recessed grooves;

the outer gasket comprising a plurality of protruding grooves;

each of the plurality of recessed grooves being disposed on the rear side of the front adapter block, perimetrically surrounding the O-ring groove;

each of the plurality of protruding grooves being positioned on a front side of the outer gasket; and each of the plurality of protruding grooves being configured to align and operably connect with the plurality of recessed grooves.

17. The electronic terminal enclosure system as claimed in claim 15 comprising:

a plurality of threaded openings being disposed on a rear side of the enclosure block;

the enclosure block being detachably connected to the enclosure via a second plurality of fasteners; and each of the second plurality of fasteners being inserted through the enclosure, through the enclosure gasket, and fastened into the plurality of threaded openings of the enclosure block.

18. The electronic terminal enclosure system as claimed in claim 17 comprising:

a plurality of outer threaded openings being disposed on the rear side of the front adapter block;

a plurality of adapter holes being disposed on the front side of the enclosure block;

the front adapter block being detachably connected to the enclosure block via a third plurality of fasteners; and each of the third plurality of fasteners being inserted through the enclosure, through the plurality of adapter holes, and fastened into the plurality of outer threaded openings.

19. The electronic terminal enclosure system as claimed in claim 17 comprising:

the enclosure block further comprising an O-ring protrusion;

the O-ring protrusion being disposed on a front side of the enclosure block; and the O-ring protrusion being configured to align and operably connect with the O-ring groove of the front adapter block.

* * * * *